US012796507B2

(12) United States Patent
Yang et al.

(10) Patent No.: US 12,796,507 B2
(45) Date of Patent: Nov. 10, 2026

(54) PACKAGE STRUCTURE AND METHOD FOR FORMING SAME

(71) Applicant: JCET Group Co., Ltd., Wuxi (CN)

(72) Inventors: Danfeng Yang, Wuxi (CN); Yao Li, Wuxi (CN); Lei Lv, Wuxi (CN); Songhua Xu, Wuxi (CN); Yaojian Lin, Wuxi (CN)

(73) Assignee: JCET Group Co., Ltd., Wuxi (CN)

( * ) Notice: Subject to any disclaimer, the term of this patent is extended or adjusted under 35 U.S.C. 154(b) by 306 days.

(21) Appl. No.: 18/800,344

(22) Filed: Aug. 12, 2024

(65) Prior Publication Data

US 2025/0062215 A1 Feb. 20, 2025

(30) Foreign Application Priority Data

Aug. 16, 2023 (CN) ........................ 202311039881.3

(51) Int. Cl.
*H10W 70/65* (2026.01)
*H10W 70/00* (2026.01)
*H10W 74/10* (2026.01)
*H10W 90/00* (2026.01)

(52) U.S. Cl.
CPC ......... *H10W 70/65* (2026.01); *H10W 70/099* (2026.01); *H10W 74/117* (2026.01); *H10W 90/401* (2026.01); *H10W 90/00* (2026.01); *H10W 90/734* (2026.01); *H10W 90/794* (2026.01)

(58) Field of Classification Search
None
See application file for complete search history.

(56) References Cited

U.S. PATENT DOCUMENTS

| | | | | |
|---|---|---|---|---|
| 2011/0062549 A1* | 3/2011 | Lin | H10D 86/85 257/532 |
| 2011/0204472 A1* | 8/2011 | Pagaila | H10W 42/20 257/528 |
| 2019/0074267 A1* | 3/2019 | Yang | H10W 42/20 |
| 2020/0091114 A1* | 3/2020 | Hsieh | H10P 72/74 |
| 2021/0125961 A1* | 4/2021 | Tsai | H10P 72/74 |
| 2023/0065366 A1* | 3/2023 | Kim | H10P 72/74 |
| 2024/0379479 A1* | 11/2024 | Lin | H10W 74/01 |
| 2024/0413040 A1* | 12/2024 | Yang | H10W 40/22 |

* cited by examiner

*Primary Examiner* — Alexander G Ghyka

(74) *Attorney, Agent, or Firm* — Arch & Lake LLP; Hao Tan; Shen Wang

(57) ABSTRACT

The present disclosure relates to a package structure and a method for forming the same. The package structure includes: a first surface and a second surface that are opposite, passive devices mounted on the first surface of the substrate; a first molding layer encapsulating the passive devices and covering the first surface of the substrate; a first chip comprising a back face and a functional face that are opposite; metal connection structures each comprising a horizontal metal strip and a vertical metal pin electrically connected to the horizontal metal strip; a second molding layer encapsulating the metal connection structures and the first chip and covering the second surface of the substrate; and first solder bumps on the exposed top surfaces of the external terminals.

20 Claims, 6 Drawing Sheets

PACKAGE STRUCTURE AND METHOD FOR FORMING SAME

CROSS-REFERENCE TO RELATED APPLICATIONS

This application is based upon and claims priority to Chinese Patent Application No. 202311039881.3, filed on Aug. 16, 2023, the entire content of which is incorporated herein by reference for all purposes.

TECHNICAL FIELD

The present disclosure relates to the technical field of semiconductor packaging, and in particular, relates to a package structure and a packaging method.

BACKGROUND

Passive devices refer to electronic devices that do not contain an electronic source and cannot amplify or regulate current or signals. These electronic devices only participate in passive functions in basic circuit structures, such as transmitting and distributing electrical energy. The most common passive devices include resistors, capacitors, inductors, ceramic resonators, crystal oscillators, transformers, or the like. From the perspective of their operating characteristics, the passive devices do not consume electrical energy themselves or convert electrical energy into other forms of energy. The passive devices function normally in response to only an input signal, with no need of an external power supply.

In packaging of a semiconductor chip, it is common to package the semiconductor chip together with corresponding passive devices to implement specific functions. In current packaging of a semiconductor chip and passive devices, the passive devices are typically placed on the back face of the semiconductor chip. The semiconductor chip and the passive devices are electrically connected via an interconnect structure that extends through a through silicon via in the semiconductor chip. However, this packaging method limits the number of passive devices that can be included and involves a complex and costly silicon via process.

SUMMARY

According to a first aspect of the present disclosure, a package structure is provided, which may include:

a substrate may include a first surface and a second surface that are opposite, where a plurality of first connection terminals are arranged on the first surface of the substrate, and a plurality of second connection terminals are arranged on the second surface of the substrate, the plurality of first connection terminals being correspondingly electrically connected to the plurality of second connection terminals;

passive devices mounted on the first surface of the substrate, where the passive devices are correspondingly electrically to the plurality of first connection terminals on the first surface of the substrate;

a first molding layer encapsulating the passive devices and covering the first surface of the substrate;

a first chip comprising a back face and a functional face that are opposite, where a plurality of external terminals are arranged on the functional face of the first chip, and the back face of the first chip is mounted on the second surface of the substrate; and metal connection structures each comprising a horizontal metal strip and a vertical metal pin electrically connected to the horizontal metal strip, where the vertical metal pin protrudes from a bottom surface of the horizontal metal strip, the metal connection structures are mounted on the second surface of the substrate, the vertical metal pins of the metal connection structures are correspondingly electrically connected to the plurality of second connection terminals on the second surface of the substrate, and the horizontal metal strips of the metal connection structures are correspondingly electrically connected to a portion of the plurality of external terminals on the functional face of the first chip;

a second molding layer encapsulating the metal connection structures and the first chip and covering the second surface of the substrate, where the second molding layer exposes top surfaces of another portion of the plurality of external terminals on the functional face of the first chip; and first solder bumps on the exposed top surfaces of the plurality of external terminals.

According to a second aspect of the present disclosure, a method for forming a package structure is provided, which may include:

providing a substrate, where the substrate comprises a first surface and a second surface that are opposite, a plurality of first connection terminals being arranged on the first surface of the substrate, a plurality of second connection terminals being arranged on the second surface of the substrate, the plurality of first connection terminals being correspondingly electrically connected to the plurality of second connection terminals;

mounting passive devices on the first surface of the substrate, where the passive devices are correspondingly electrically to the plurality of first connection terminals on the first surface of the substrate;

forming a first molding layer encapsulating the passive devices and covering the first surface of the substrate;

providing a first chip comprising a back face and a functional face that are opposite, where a plurality of external terminals are arranged on the functional face;

mounting the back face of the first chip on the second surface of the substrate;

providing metal connection structures, where each of the metal connection structures comprises a horizontal metal strip and a vertical metal pin electrically connected to the horizontal metal strip, the vertical metal pin protruding from a bottom surface of the horizontal metal strip;

mounting the metal connection structures on the second surface of the substrate, the vertical metal pins of the metal connection structures are correspondingly electrically connected to the plurality of second connection terminals on the second surface of the substrate, and the horizontal metal strips of the metal connection structures are correspondingly electrically connected to a portion of the plurality of external terminals on the functional face of the first chip;

forming a second molding layer encapsulating the metal connection structures and the first chip and covering the second surface of the substrate, where the second molding layer exposes top surfaces of another portion of the plurality of external terminals on the functional face of the first chip; and forming first solder bumps on the exposed top surfaces of the plurality of external terminals.

It is to be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to embodiments, examples of which are illustrated in the accompanying drawings. The following description refers to the accompanying drawings in which the same numbers in different drawings represent the same or similar elements unless otherwise represented. The implementations set forth in the following description of embodiments do not represent all implementations consistent with the present disclosure. Instead, they are merely examples of apparatuses and methods consistent with aspects related to the present disclosure as recited in the appended claims.

Some embodiments of the present disclosure provide a method for forming a package structure. Hereinafter, the method is described with reference to the accompanying drawings.

Figure 1:
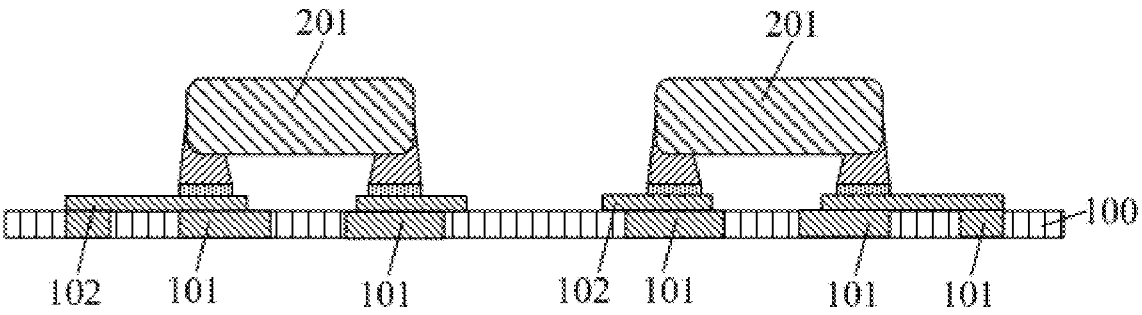
FIG. 1 is a schematic structural diagram of providing a substrate in a process for forming a package structure according to some embodiments of the present disclosure.

Referring to FIG. 1, a substrate 100 is provided. The substrate 100 includes a first surface and a second surface that are opposite. A plurality of first connection terminals are arranged on the first surface of the substrate 100, and a plurality of second connection terminals are arranged on the second surface of the substrate 100. The first connection terminals are correspondingly electrically connected to the second connection terminals. Passive devices 201 are mounted on the first surface of the substrate 100. The passive devices 201 are correspondingly electrically connected to the first connection terminals on the first surface of the substrate 100.

In some specific embodiments, the substrate 100 is a metal lead frame. A plurality of discrete pins 101 are arranged in the metal lead frame. Any two adjacent pins 101 are isolated by an isolation layer. An upper surface and a lower surface of each of the discrete pins 101 are respectively used as the first connection terminal and the second connection terminal. In some other embodiments, the metal lead frame includes a first surface and a second surface that are opposite. First redistribution layers 102 are further formed on the first surface of the metal lead frame. The first redistribution layers 102 interconnect a portion of the pins 101. In this case, the first redistribution layers 102 formed on the first surface of the metal lead frame are used as the first connection terminals, and the lower surfaces of the pins 101 are used as the second connection terminals. The first redistribution layers 102 may be made of one or more of Al, Cu, Ag, Au, Pt, Ni, Ti, TiN, TaN, Ta, TaC, W, or WN.

In some other embodiments, the substrate 100 may be a silicon substrate, a PCB substrate, a resin substrate, a ceramic substrate, or a glass substrate. Each of the silicon substrate, the PCB substrate, the resin substrate, the ceramic substrate, and the glass substrate includes the first surface and the second surface that are opposite, a plurality of first pads are arranged on the first surface, a plurality of second pads are arranged on the second surface, connection traces connecting the first pads and the second pads corresponding thereto are arranged in each of the silicon substrate, the PCB substrate, the resin substrate, the ceramic substrate, and the glass substrate, the first pads are directly used as the first terminals, and the second pads are directly used as the second connection terminals. In some embodiments, first redistribution layers 102 electrically connected to the first pads are formed on the first surface of the silicon substrate, the PCB substrate, the resin substrate, the ceramic substrate, or the glass substrate. In this case, the first redistribution layers 102 on the first surface of the first surface of the silicon substrate, the PCB substrate, the resin substrate, the ceramic substrate, or the glass substrate are used as the first terminals, and the second pads are used as the second connection terminals. The package structure according to the present disclosure implements packaging of different types of substrates.

The number of mounted passive devices 201 may be one or more (two or more than two). In the present disclosure, description is given using two passive devices 201 as examples. Each of the passive devices 201 may be one or more of a resistor, a capacitor, or an inductor. The passive device 201 may be one or more of a ceramic resonator, a crystal oscillator, a transformer, a converter, a tapered transformer, a matching network, a resonator, a filter, a mixer, a switch, an electrical bridge, or an antenna.

The passive device 201 has pins. In some embodiments, the passive devices 201 are mounted on the first surface of the substrate 100 via metal bonding assist layers, and the passive devices 201 are correspondingly electrically to the first connection terminals on the first surface of the substrate 100. In some embodiments, the metal bonding assist layer includes a solder layer, and the metal bonding assist layer is made of one or more of tin, tin-silver, tin-lead, silver-copper, tin-silver-copper, tin-silver-zinc, tin-zinc, tin-bismuth-indium, tin-indium, tin-gold, tin-copper, tin-zinc-indium, or tin-silver-antimony. The metal bonding assist layer may also be made of silver, nickel-gold, or nickel-palladium-gold.

Figure 2:
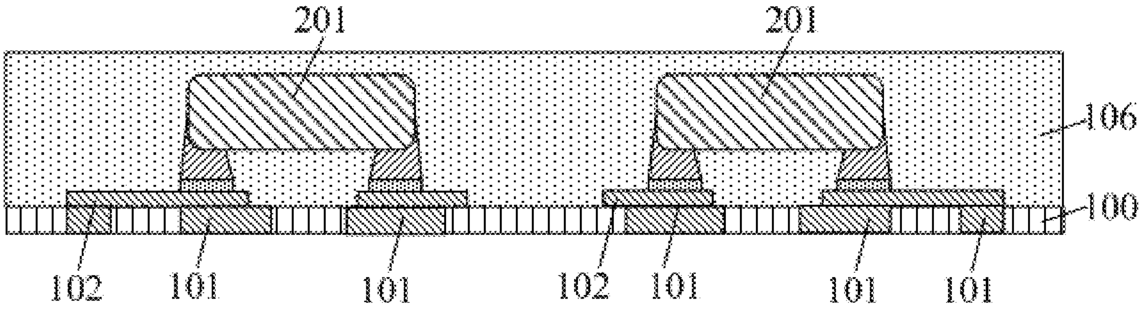
FIG. 2 is a schematic structural diagram of forming a first molding layer encapsulating passive devices and covering a first surface of a substrate in the process for forming the package structure according to some embodiments of the present disclosure.

Referring to FIG. 2, a first molding layer 106 encapsulating the passive devices 201 and covering the first surface of the substrate 100 is formed.

The first molding layer 106 is configured to protect and seal the passive devices 201.

In some embodiments, the first molding layer 106 may be made of filler-containing epoxy resin, polyimide resin, benzocyclobutene resin, or polybenzoxazole resin; or may be filler-containing polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, or polyvinyl alcohol. The filler may be an inorganic filler or an organic filler. The first molding layer 106 may be formed by an injection molding processing or a rotational molding process.

Figure 3:
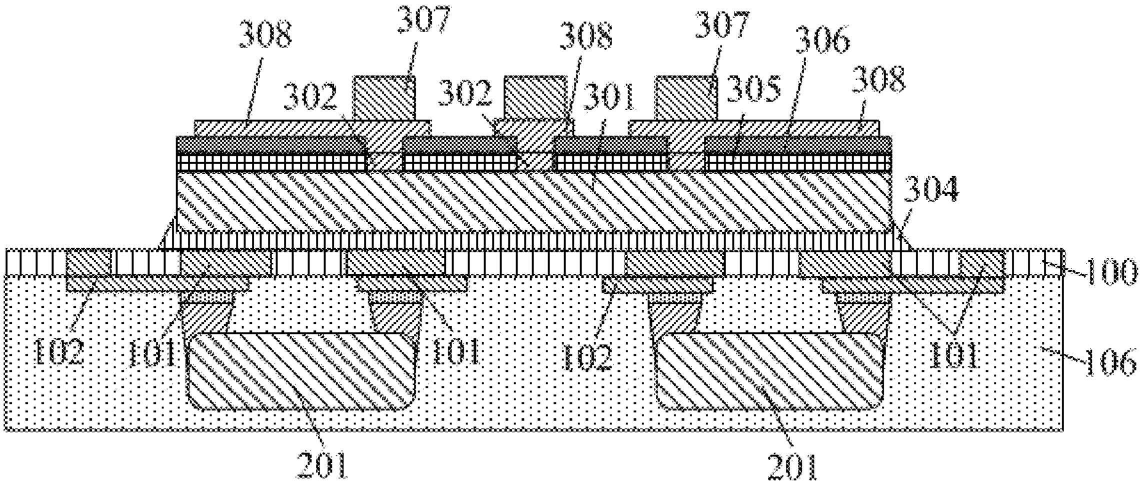
FIG. 3 is a schematic structural diagram of providing a first chip in the process for forming the package structure according to some embodiments of the present disclosure.

Referring to FIG. 3, a first chip 301 is provided. The first chip 301 includes a back face and a functional face that are opposite. A plurality of external terminals are arranged on the functional face of the first chip 301, and the back face of the first chip 301 is mounted on the second surface of the substrate 100.

A portion of the external terminals on the functional face of the first chip 301 are subsequently configured to be electrically connected to the horizontal metal strips of the metal connection structures, and first solder bumps are subsequently formed on top surfaces of another portion of the external terminals on the functional face of the first chip 301.

In some embodiments, still referring to FIG. 3, a plurality of third pads 302 are arranged on the functional face of the first chip 301, and second redistribution layers 308 correspondingly electrically connected to the third pads 302 are further arranged on the functional face. A portion of the second redistribution layers 308 are used as the external terminals electrically connected to the horizontal metal strips of the metal connection structures, and protruded metal pillars 307 are further arranged on a portion of the second redistribution layers 308. The metal pillars 307 are used as the external terminals with the first solder bumps subsequently formed on the top surfaces thereof. The third pads 302 are isolated by an insulating layer 305, the second redistribution layers 308 are isolated by a passivation layer 306, and the second redistribution layers 308 are isolated from the third pads 302 by the passivation layer 306. First openings exposing surfaces of the third pads 302 are arranged in the passivation layer 306. The second redistribution layers 308 are disposed in the first openings and a portion of surfaces of the passivation layer on both sides of the first openings. In some other embodiments, the external terminals of the first chip 301 may have different specific structures, which will be described in detail hereinafter.

In some embodiments, the third pads 302 are made of one or more of aluminum, nickel, tin, tungsten, platinum, copper, titanium, chromium, tantalum, gold, or silver; the second redistribution layers 308 and the metal pillars 307 are all made of one or more of aluminum, nickel, tin, tungsten, platinum, copper, titanium, chromium, tantalum, gold, or silver. The insulating layer 305 is made of one or more of silicon oxide, silicon nitride, silicon oxynitride, silicon carbide, or silicon carbonitride. The passivation layer 306 may be made of a polymer material, for example, resin.

The back face of the first chip 301 is mounted to the second surface of the substrate 100 via adhesive 304.

In some embodiments, the first chip 301 may be one of a signal processing chip, a logic control chip, a memory chip, a sensor chip, a power supply chip, or a radio frequency chip.

Figure 4:
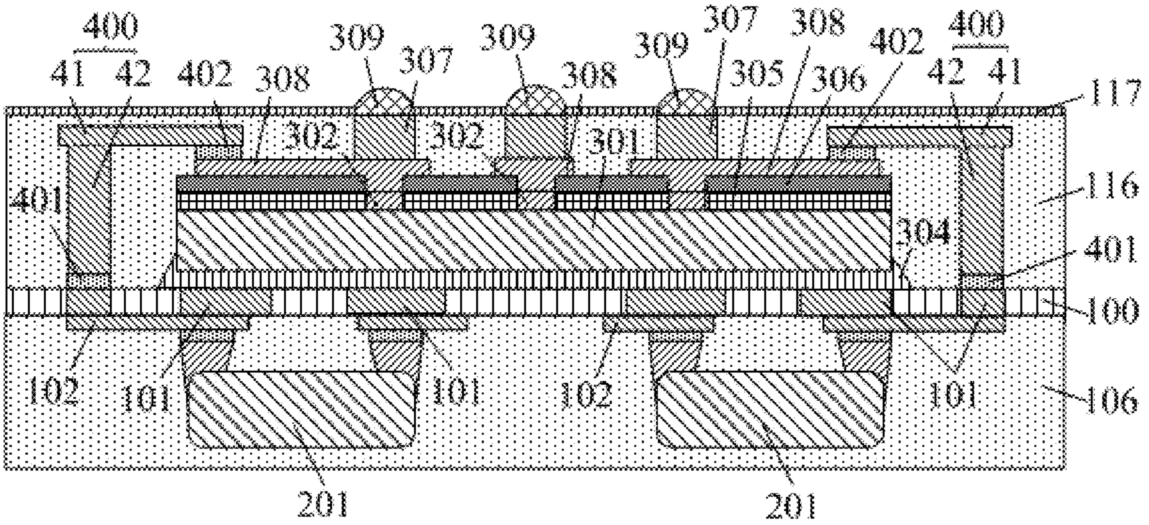
FIG. 4 is a schematic structural diagram of providing metal connection structures in the process for forming the package structure according to some embodiments of the present disclosure.

Referring to FIG. 4, metal connection structures 400 each including a horizontal metal strip 41 and a vertical metal pin 42 electrically connected to the horizontal metal strip 41 are provided, wherein the vertical metal pin 42 protrudes from a bottom surface of the horizontal metal strip 41; and the metal connection structures 400 are mounted on the second surface of the substrate 100, wherein the vertical metal pins 42 of the metal connection structures 400 are correspondingly electrically connected to the second connection terminals on the second surface of the substrate 100, and the horizontal metal strips 41 of the metal connection structures 400 are correspondingly electrically connected to a portion of the external terminals on the functional face of the first chip 301.

In some specific embodiments, the horizontal metal strip 41 and the vertical metal pin 42 of each of the metal connection structures 400 are formed as an integral structure (in FIG. 4, for ease of differentiation, the horizontal metal strip 41 and the vertical metal pin 42 are separated by a dotted line). The horizontal metal strip 41 and the vertical metal pin 42 are made of the same material. The horizontal metal strip 41 and the vertical metal pin 42 may be made of one of more of W, Al, Cu, Ti, Ag, Au, Pt, or Ni. The metal connection structures 400 may be fabricated by mechanical machining or molding processes. In some other embodiments, the metal connection structures 400 may have different specific structures, which will be described in detail hereinafter.

In some embodiments, the vertical metal pins 42 of the metal connection structures 400 are correspondingly electrically connected to the second connection terminals (referring to FIG. 4, the second connection terminals are lower surfaces of pins 101 in the substrate 100) on the second surface of the substrate 100. In some other embodiments, when the second pads on the second surface of the substrate are used as the second connection terminals, the vertical metal pins 42 of the metal connection structures 400 are correspondingly electrically connected to the second pads on the second surface of the substrate.

In some embodiments, when the metal connection structures 400 are mounted on the second surface of the substrate 100, bottom surfaces of the vertical metal pins 42 of the metal connection structures 400 are correspondingly electrically connected to the second connection terminals on the second surface of the substrate 100 via first bonding assist layers 401, and bottom surfaces of the horizontal metal strips 41 of the metal connection structures 400 are correspondingly electrically connected to a portion of the external terminals (for example, the second redistribution layers 308) on the functional face of the first chip 301 via second bonding assist layers 402.

The first bonding assist layer 401 and the second bonding assist layer 402 each include a solder layer. The first bonding assist layer 401 and the second bonding assist layer 402 are made of one or more of tin, tin-silver, tin-lead, silver-copper, tin-silver-copper, tin-silver-zinc, tin-zinc, tin-bismuth-indium, tin-indium, tin-gold, tin-copper, tin-zinc-indium, or tin-silver-antimony. The first bonding assist layer 401 and the second bonding assist layer 402 may also be made of silver, nickel-gold, or nickel-palladium-gold.

In the present disclosure, the metal connection structures 400 are mounted on the second surface of the substrate 100 by a mounting process to interconnect the first chip 301 to the substrate 100. In addition, by the substrate 100, interconnection between the first chip 301 and the passive devices 201 is achieved, such that the forming process is simplified, and the fabrication cost is lowered.

Still referring to FIG. 4, a second molding layer 116 encapsulating the metal connection structures 400 and the first chip 301 and covering the second surface of the substrate 100 is formed, wherein the second molding layer 116 exposes top surfaces of another portion of the external terminals on the functional face of the first chip 301; and first solder bumps 309 are formed on the exposed top surfaces of the external terminals.

The second molding layer 116 is configured to protect and seal the metal connection structures 400 and the first chip 301.

In some embodiments, the second molding layer 116 may be made of filler-containing epoxy resin, polyimide resin, benzocyclobutene resin, or polybenzoxazole resin; or may be filler-containing polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, or polyvinyl alcohol. The filler may be an inorganic filler or an organic filler. The second molding layer 116 may be formed by an injection molding processing or a rotational molding process.

In some specific embodiments, the other external terminals are metal pillars 307. Upon formation of the second molding layer 116, the second molding layer 116 is subjected to a chemical mechanical polishing (CMP) process or an etching process, such that the formed second molding layer 116 exposes the top surfaces of the other external terminals (the metal pillars 307).

The first solder bumps 309 may be configured to be connect to other package structures, package substrates, or semiconductor chips. The first solder bumps 309 are in the shape of cubes, spheres, or ellipsoids.

In some embodiments, the first solder bumps 309 may be made of one or more of tin, tin-silver, tin-lead, tin-silver-copper, tin-silver-zinc, tin-zinc, tin-bismuth-indium, tin-indium, tin-gold, tin-copper, tin-zinc-indium, or tin-silver-antimony. The first solder bumps 309 are formed by a screen printing or reflow process.

In some embodiments, prior to forming the first solder bumps 309, a solder resist layer 117 is formed on the surface of the second molding layer 116.

In the method for forming the package structure according to the embodiments of the present disclosure, passive devices are mounted on a first surface of a substrate, and a first molding layer encapsulating the passive devices and covering the first surface of the substrate is formed; a back face of a first chip is mounted on a second surface of the substrate; metal connection structures are provided, wherein each of the metal connection structures includes a horizontal metal strip and a vertical metal pin electrically connected to the horizontal metal strip, wherein the vertical metal pin protrudes from a bottom surface of the horizontal metal strip; and the metal connection structures are mounted on the second surface of the substrate, wherein the vertical metal pins of the metal connection structures are correspondingly electrically connected to the second connection terminals on the second surface of the substrate, and the horizontal metal strips of the metal connection structures are correspondingly electrically connected to a portion of the external terminals on the functional face of the first chip. When mounting the passive devices, the number of passive devices in the package is increased since the passive devices are not limited by the area of the back face of the first chip. In addition, the metal connection structures are mounted on the second surface of the substrate, the first chip and the substrate are interconnected, and interconnection between the first chip and the passive devices are achieved by the substrate. The mounting process of the metal connection structures is simpler relative to the through silicon via process, and thus the cost is lowered.

Figure 5:
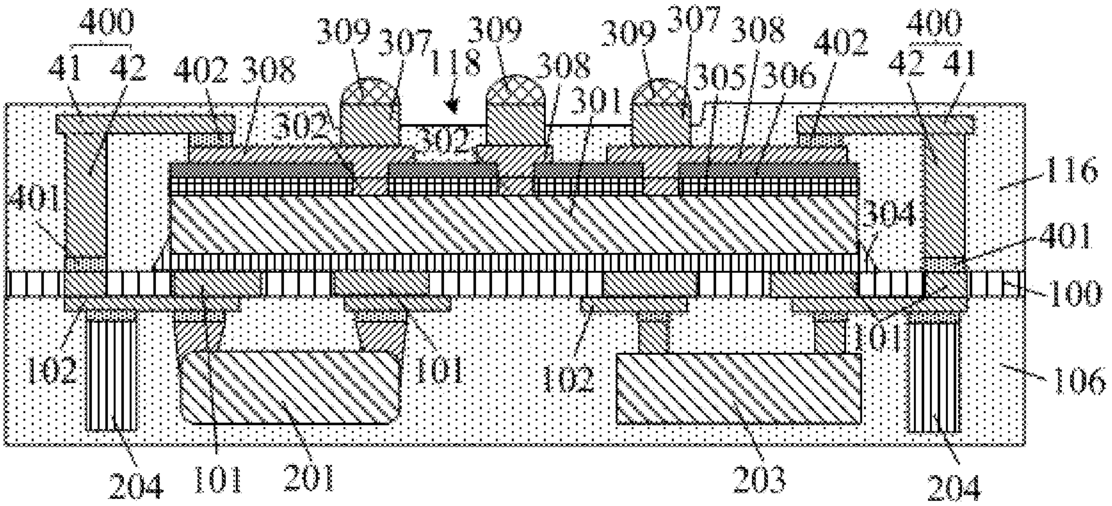
FIG. 5 is a schematic structural diagram of a process for forming a package structure according to some embodiments of the present disclosure.

Some other embodiments of the present disclosure further provide a method for forming a package structure. Referring to FIG. 5, different from the above embodiments (the embodiments as illustrated in FIG. 1 to FIG. 4), in the embodiments herein, heat sinks 204 are provided, wherein the heat sinks 204 are mounted on the first surface of the substrate 100; a second chip 203 is provided, wherein the second chip 203 is mounted on the first surface of the substrate 100, and the second chip 203 is electrically connected to the substrate 100; and openings 118 exposing top surfaces and portions of sidewall surfaces of the metal pillars 307 are arranged in the second molding layer 116.

The heat sink 204 is configured to improve heat dissipation performance of the back face of the first chip 301, and enhance rigidity of at the corresponding position of the package structure to balance the package structure or prevent warpage of the package structure. The heat sinks 204 are made of a material with high thermal conductivity coefficient and low thermal expansion coefficient. A thermal conductivity coefficient of the heat sinks 204 is greater than or equal to 50 W/m·K, and a thermal expansion coefficient of the third heat sinks 204 is less than or equal to 17 ppm/C. In a specific embodiment, the thermal expansion coefficient of the heat sinks 204 is less than or equal to 7 ppm/C, such that the heat sinks 204 better enhances the rigidity at the corresponding position of the package structure while better improving the heat dissipation performance of the back face of the first chip 301, and hence the package structure is better balanced, and the warpage of the package structure is better prevented. In some embodiments, the heat sinks 204 may be made of copper, aluminum, gold, nickel, steel, or stainless steel, or a carbon-containing material (for example, graphite, graphene, or carbon nanomaterial), or Si.

In some embodiments, the heat sinks 204 may be mounted while the passive devices 201 are being mounted, or may be mounted upon or prior to mounting of the passive devices 201. The heat sinks 204 are mounted on the first surface of the substrate 100 via a thermal adhesive or sintered silver. The heat sinks 204 may be mounted on surfaces of a portion of the first connection terminals on the first surface of the substrate 100. In some specific embodiments, the heat sinks 204 may be mounted on surfaces of surfaces of the first redistribution layers 102 on the first surface of the substrate 100.

In some embodiments, the first molding layer 106 may wrap the sidewalls and the bottom surfaces of the heat sinks 204. In some embodiments, the first molding layer 106 may only wrap the sidewall surfaces of the heat sinks 204, while exposing the top surfaces of the heat sinks 204.

The second chip 203 is flip-mounted on the first surface of the substrate 100, and is electrically connected to the substrate 100. In some specific embodiments, the second chip 203 has a functional face and a back face that are opposite. Protruded metal bumps are arranged on the functional face. When the second chip 203 is flip-mounted on the first surface of the substrate 100, the protruded metal bumps on the functional face of the second chip 203 are soldered to a portion of the first connection terminals (for example, the first redistribution layers 102) on the first surface of the substrate 100.

In some embodiments, the second chip 203 may be one of a signal processing chip, a logic control chip, a memory chip, a sensor chip, a power supply chip, or a radio frequency chip.

Figure 6:
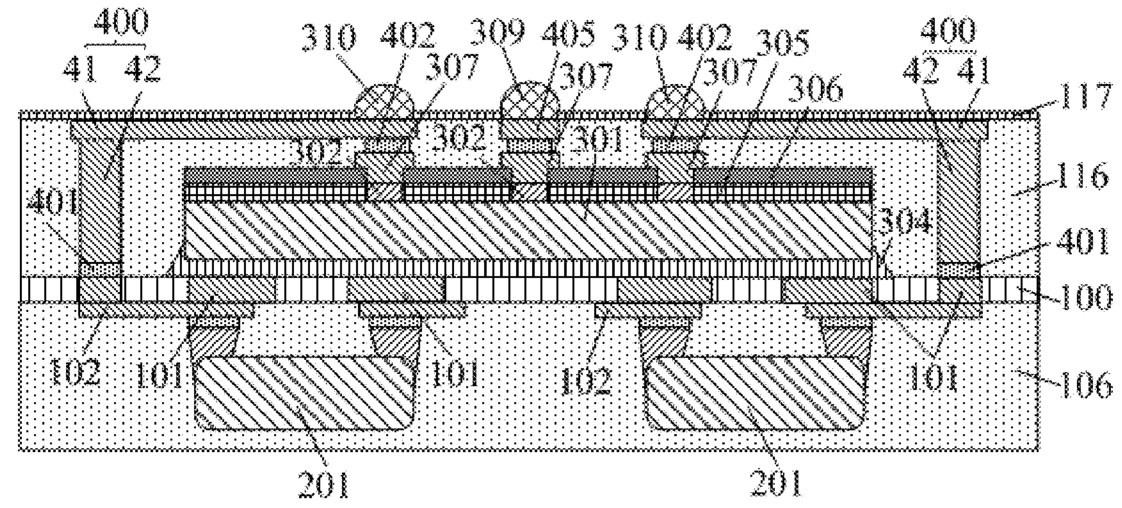
FIG. 6 is a schematic structural diagram of a process for forming a package structure according to some embodiments of the present disclosure.

Some other embodiments of the present disclosure further provide a method for forming a package structure. Referring to FIG. 6, different from the above embodiments (the embodiments as illustrated in FIG. 1 to FIG. 5), in the embodiments herein, a plurality of third pads 302 are arranged on the functional face of the first chip 301, wherein protruded metal pillars 307 are arranged on the third pads 302, and a portion of the metal pillars 307 are used as the external terminals electrically connected to the horizontal metal strips 41 of the metal connection structures 400, and another portion of the metal pillars 307 are used as the external terminals with the first solder bumps 309 formed on the top surfaces thereof; and second solder bumps 310 are formed on portions of top surfaces of the horizontal metal strips 41 of the metal connection structures 400.

The second solder bumps 310 may be configured to be connect to other package structures, package substrates, or semiconductor chips. The second solder bumps 310 are in the shape of cubes, spheres, or ellipsoids.

In some embodiments, the second solder bumps 310 may be made of one or more of tin, tin-silver, tin-lead, tin-silver-copper, tin-silver-zinc, tin-zinc, tin-bismuth-indium, tin-indium, tin-gold, tin-copper, tin-zinc-indium, or tin-silver-antimony. The second solder bumps 310 are formed by a screen printing or reflow process.

In some embodiments, the second solder bumps 310 have a same size as or different sizes from the first solder bumps 309; and the second solder bumps 310 are disposed outside or inside a boundary of the first chip 301. In some specific embodiments, referring to FIG. 6, the second solder bumps 310 have a same size as the first solder bumps 309; and the second solder bumps 310 are disposed inside a boundary of the first chip 301.

Figure 7:
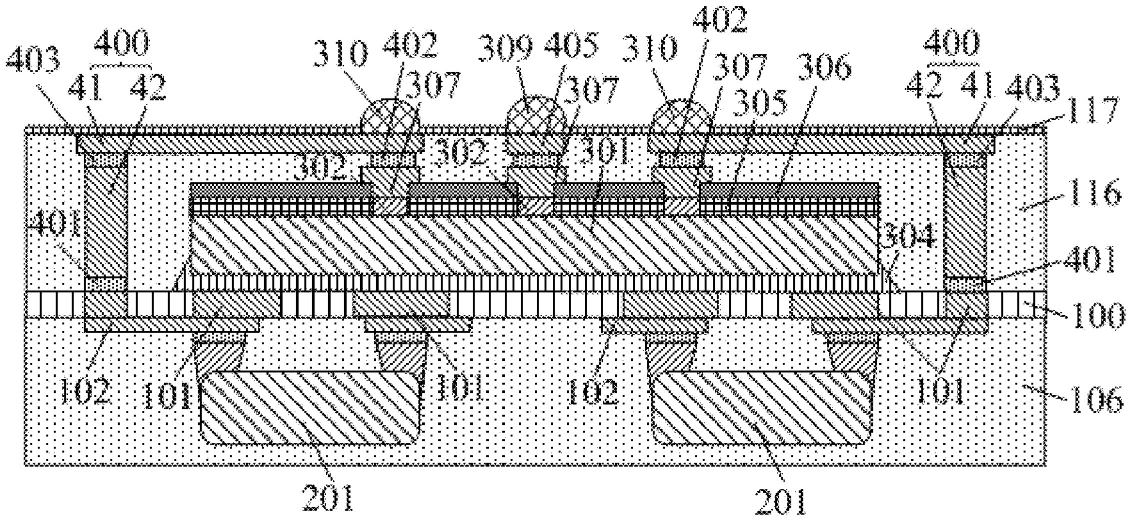
FIG. 7 is a schematic structural diagram of a process for forming a package structure according to some embodiments of the present disclosure.

Some other embodiments of the present disclosure further provide a method for forming a package structure. Referring to FIG. 7, different from the above embodiments (the embodiments as illustrated in FIG. 1 to FIG. 6), in the embodiments herein, a horizontal metal strip 41 and a vertical metal pin 42 of each of the metal connection structures 400 are discrete structures, and a bottom surface of the horizontal metal strip and a top surface of the vertical metal pin are soldered together via a solder layer 403.

The solder layer 403 is made of one or more of tin, tin-silver, tin-lead, tin-silver-copper, tin-silver-zinc, tin-zinc, tin-bismuth-indium, tin-indium, tin-gold, tin-copper, tin-zinc-indium, or tin-silver-antimony.

Figure 8:
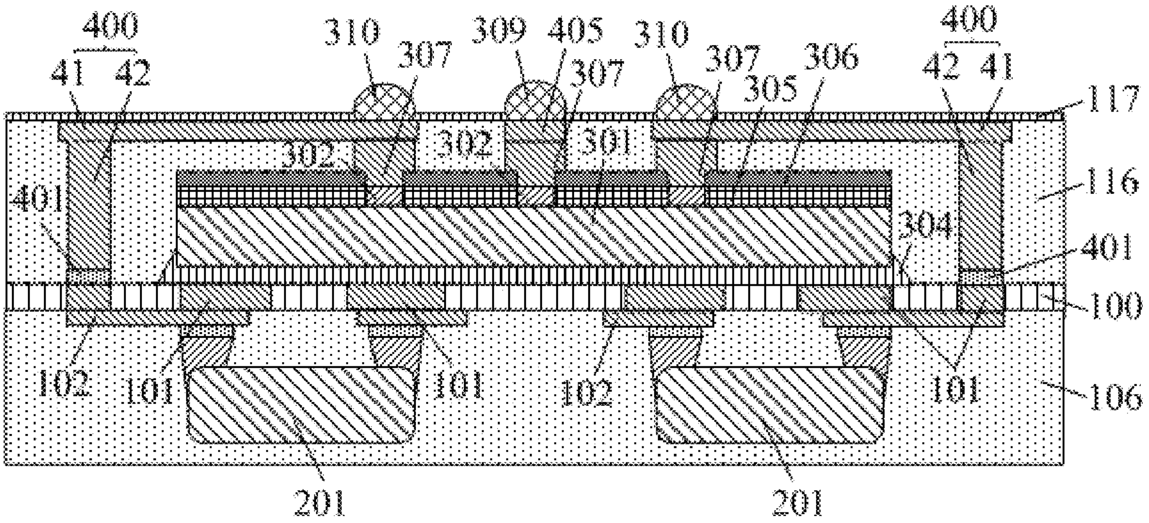
FIG. 8 is a schematic structural diagram of a process for forming a package structure according to some embodiments of the present disclosure.

Some other embodiments of the present disclosure further provide a method for forming a package structure. Referring to FIG. 8, different from the above embodiments (the embodiments as illustrated in FIG. 1 to FIG. 7), in the embodiments herein, a horizontal metal strip 41 and a vertical metal pin 42 of each of the metal connection structures 400 are discrete structures, and the horizontal metal strip 41 is formed on a top surface of the vertical metal pin 42 by an electroplating process.

Figure 9:
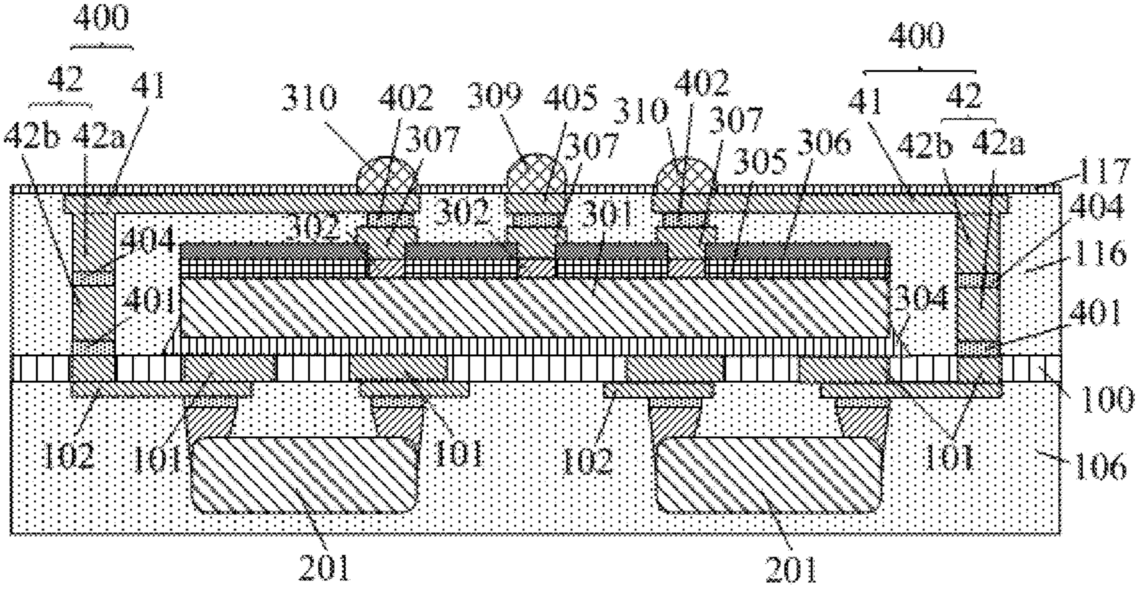
FIG. 9 is a schematic structural diagram of a process for forming a package structure according to some embodiments of the present disclosure.

Some other embodiments of the present disclosure further provide a method for forming a package structure. Referring to FIG. 9, different from the above embodiments (the embodiments as illustrated in FIG. 1 to FIG. 8), in the embodiments herein, the vertical metal pin 42 of the each of the metal connection structures 400 includes a first portion 42*a* and a second portion 42*b*, wherein the first portion 42*a* is disposed over the second portion 42*b*, a bottom end of the first portion 42*a* and a top end of the second portion 42*b* are soldered together via a solder layer 404, and the first portion 42*a* and the horizontal metal strip 41 of the each of the metal connection structures 400 are formed as an integral structure.

The solder layer 404 is made of one or more of tin, tin-silver, tin-lead, tin-silver-copper, tin-silver-zinc, tin-zinc, tin-bismuth-indium, tin-indium, tin-gold, tin-copper, tin-zinc-indium, or tin-silver-antimony.

Figure 10:
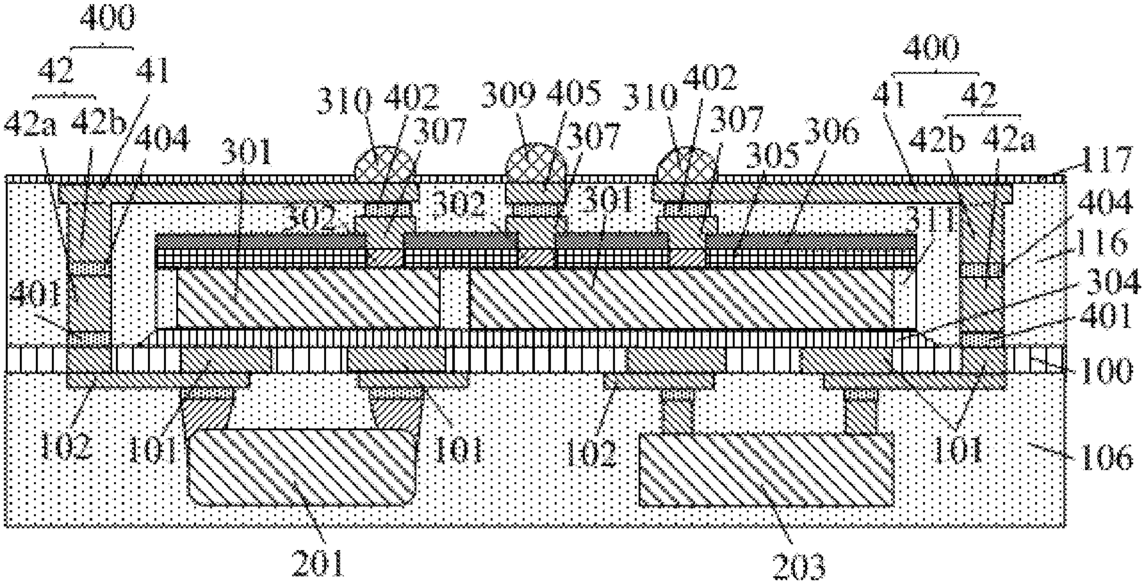
FIG. 10 is a schematic structural diagram of a process for forming a package structure according to some embodiments of the present disclosure.

Some other embodiments of the present disclosure further provide a method for forming a package structure. Referring to FIG. 10, different from the above embodiments (the embodiments as illustrated in FIG. 1 to FIG. 9), in the embodiments herein, a plurality of the first chips 301 (two or more than two first chips 301) are provided; and using two first chips 301 as examples, upon molding of the first chips 301 by a third molding layer 311, the first chips 301 are mounted on the second surface of the substrate 100.

Figure 11:
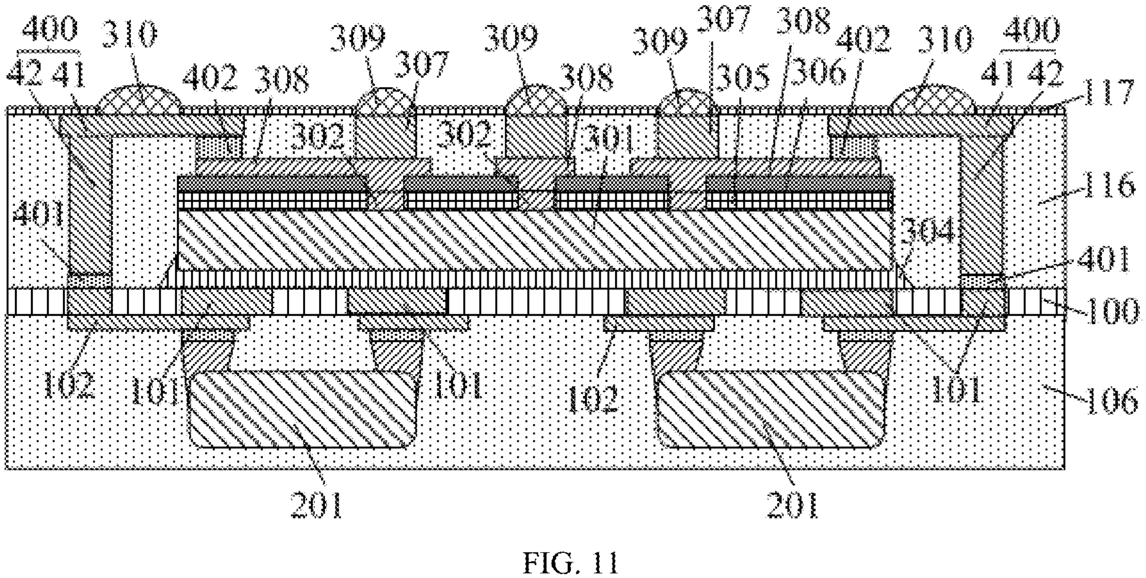
FIG. 11 is a schematic structural diagram of a process for forming a package structure according to some embodiments of the present disclosure.
Figure 12:
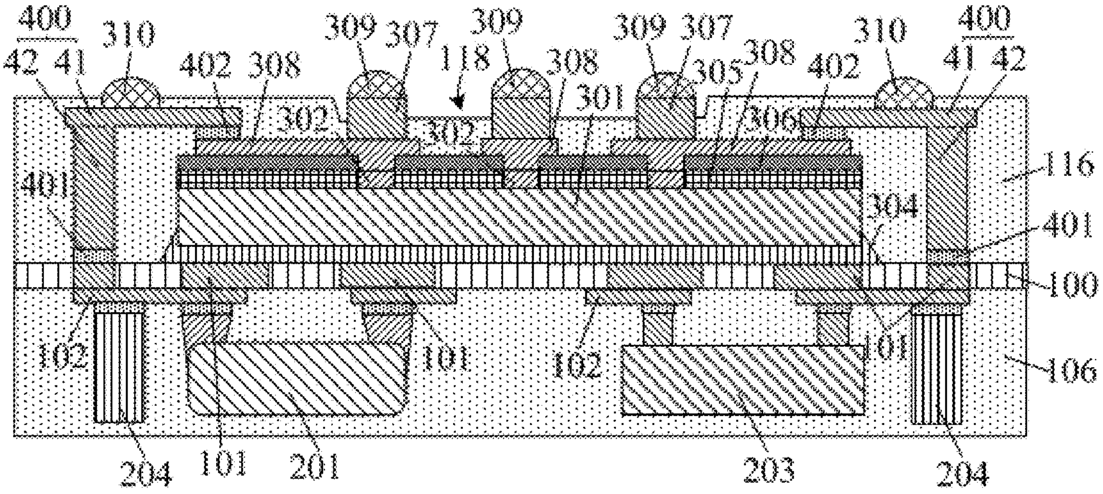
FIG. 12 is a schematic structural diagram of a process for forming a package structure according to some embodiments of the present disclosure.
Figure 13:
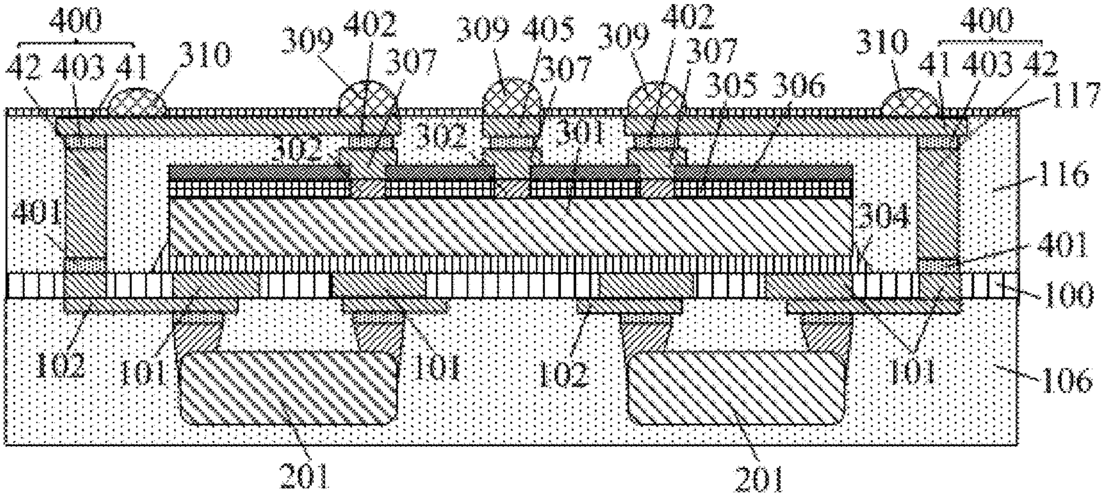
FIG. 13 is a schematic structural diagram of a process for forming a package structure according to some embodiments of the present disclosure.

Some other embodiments of the present disclosure further provide a method for forming a package structure. Referring to FIG. 11, FIG. 12, or FIG. 13, different from the above embodiments (the embodiments as illustrated in FIG. 1 to FIG. 10), in the embodiments herein, second solder bumps 310 are formed on portions of top surfaces of the horizontal metal strips 41 of the metal connection structures 400. The second solder bumps 310 are disposed outside a boundary of the first chip 301, and the second solder bumps 310 have a same size (referring to FIG. 12 or FIG. 13) as or different sizes from the first solder bumps 309.

When the second solder bumps 310 have different sizes from the first solder bumps 309, specifically referring to FIG. 11, the second solder bumps 310 are larger than the first solder bumps 309.

Figure 14:
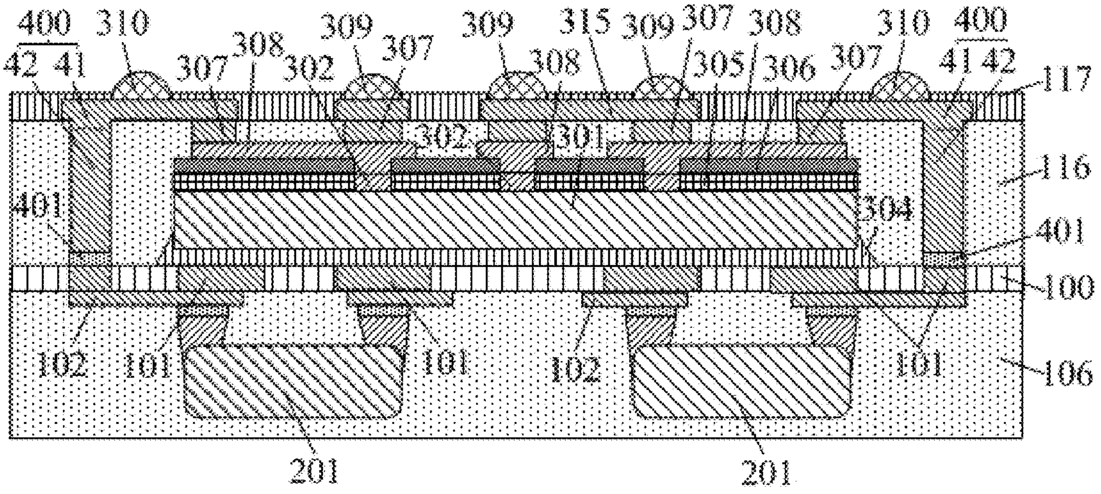
FIG. 14 is a schematic structural diagram of a process for forming a package structure according to some embodiments of the present disclosure.

Some other embodiments of the present disclosure further provide a method for forming a package structure. Referring to FIG. 14, different from the above embodiments (the embodiments as illustrated in FIG. 1 to FIG. 10), in the embodiments herein, a plurality of third pads 302 are arranged on the functional face of the first chip 301, and second redistribution layers 308 correspondingly electrically connected to the third pads 302 are further arranged on the functional face, protruded metal pillars 307 being arranged on the second redistribution layers 308, wherein in the metal pillars 307, those at edges of the second redistribution layers 308 are used as the external terminals electrically connected to the horizontal metal strips 41 of the metal connection structures 400 and those at middle portions of the second redistribution layers 308 are used as the external terminals with the first solder bumps 309 formed on the top surfaces thereof; and second solder bumps 310 are formed on portions of top surfaces of the horizontal metal strips 41 of the metal connection structures 400, wherein the second solder bumps 310 are disposed outside a boundary of the first chip 301, and the second solder bumps 310 have a same size as or different sizes from the first solder bumps 309.

Some embodiments of the present disclosure provide a package structure. Referring to FIG. 4, the package structure includes:

a substrate 100 including a first surface and a second surface that are opposite, wherein a plurality of first connection terminals are arranged on the first surface of the substrate 100, and a plurality of second connection terminals are arranged on the second surface of the substrate 100, the first connection terminals being correspondingly electrically connected to the second connection terminals;

passive devices 201 mounted on the first surface of the substrate 100, wherein the passive devices 201 are correspondingly electrically to the first connection terminals on the first surface of the substrate 100;

a first molding layer 106 encapsulating the passive devices 201 and covering the first surface of the substrate 100;

a first chip 301 including a back face and a functional face that are opposite, wherein a plurality of external terminals are arranged on the functional face of the first chip 301, and the back face of the first chip 301 is mounted on the second surface of the substrate 100; and metal connection structures 400 each including a horizontal metal strip 41 and a vertical metal pin 42 electrically connected to the horizontal metal strip 41, wherein the vertical metal pin 42 protrudes from a bottom surface of the horizontal metal strip 41, the metal connection structures 400 are mounted on the second surface of the substrate 100, the vertical metal pins 42 of the metal connection structures 400 are correspondingly electrically connected to the second connection terminals on the second surface of the substrate 100, and the horizontal metal strips 41 of the metal connection structures 400 are correspondingly electrically connected to a portion of the external terminals on the functional face of the first chip 301;

a second molding layer 116 encapsulating the metal connection structures 400 and the first chip 301 and covering the second surface of the substrate 100, wherein the second molding layer 116 exposes top surfaces of another portion of the external terminals on the functional face of the first chip 301; and first solder bumps 309 on the exposed top surfaces of the external terminals.

In some embodiments, referring to FIG. 4, the horizontal metal strip 41 and the vertical metal pin 42 of the each of the metal connection structures 400 are formed as an integral structure.

In some embodiments, referring to FIG. 7, the horizontal metal strip 41 and the vertical metal pin 42 of the each of the metal connection structures 400 are discrete structures, and a bottom surface of the horizontal metal strip 41 is soldered to a top surface of the vertical metal pin 42 via a solder layer 403.

In some embodiments, referring to FIG. 9, the vertical metal pin 42 of the each of the metal connection structures 400 includes a first portion 42*a* and a second portion 42*b*, wherein the first portion 42*a* is disposed over the second portion 42*b*, a bottom end of the first portion 42*a* and a top end of the second portion 42*b* are soldered together via a solder layer 404, and the first portion 42*a* and the horizontal metal strip 41 of the each of the metal connection structures 400 are formed as an integral structure.

In some embodiments, referring to FIG. 8, the horizontal metal strip 41 and the vertical metal pin 42 of the each of the metal connection structures 400 are discrete structures, and the horizontal metal strip 41 and a top surface of the vertical metal pin 42 are formed together by an electroplating process.

In some embodiments, referring to any of FIG. 4 to FIG. 7, bottom surfaces of the vertical metal pins 42 of the metal connection structures 400 are correspondingly electrically connected to the second connection terminals on the second surface of the substrate 100 via first bonding assist layers 401, and bottom surfaces of the horizontal metal strips 41 of the metal connection structures 400 are correspondingly electrically connected to a portion of the external terminals on the functional face of the first chip 301 via second bonding assist layers 402.

In some embodiments, the substrate 100 is a metal lead frame, a silicon substrate, a PCB substrate, a resin substrate, a ceramic substrate, or a glass substrate.

In some specific embodiments, referring to any of FIG. 4 to FIG. 14, a plurality of discrete pins 101 are arranged in the metal lead frame. An upper surface and a lower surface of each of the discrete pins 101 are respectively used as the first connection terminal and the second connection terminal.

In some other embodiments, each of the silicon substrate, the PCB substrate, the resin substrate, the ceramic substrate, and the glass substrate includes the first surface and the second surface that are opposite, a plurality of first pads are arranged on the first surface, a plurality of second pads are arranged on the second surface, connection traces connecting the first pads and the second pads corresponding thereto are arranged in each of the silicon substrate, the PCB substrate, the resin substrate, the ceramic substrate, and the glass substrate, the first pads are directly used as the first terminals, and the second pads are directly used as the second connection terminals.

In some embodiments, referring to any of FIG. 4 to FIG. 14, first redistribution layers 102 are arranged on the first surface of the substrate 100. The first redistribution layers 102 are used as the first connection terminals.

In some embodiments, referring to FIG. 4, FIG. 5, FIG. 11, or FIG. 12, a plurality of third pads 302 are arranged on the functional face of the first chip 301, and second redistribution layers 308 correspondingly electrically connected to the third pads 302 are further arranged on the functional face. A portion of the second redistribution layers 308 are used as the external terminals electrically connected to the horizontal metal strips 41 of the metal connection structures 400, and protruded metal pillars 307 are further arranged on a portion of the second redistribution layers 308. The metal pillars 307 are used as the external terminals with the first solder bumps 309 formed on the top surfaces thereof.

In some embodiments, referring to any of FIG. 6 to FIG. 10, or FIG. 13, a plurality of third pads 302 are arranged on the functional face of the first chip 301, wherein protruded metal pillars 307 are further arranged on the third pads 302. A portion of the protruded metal pillars 307 are used as the external terminals electrically connected to the horizontal metal strips 41 of the metal connection structures 400, and another portion of the metal pillars 307 are used as the external terminals with the first solder bumps 309 formed on the top surfaces thereof.

In some embodiments, referring to FIG. 14, a plurality of third pads 302 are arranged on the functional face of the first chip 301, and second redistribution layers 308 correspondingly electrically connected to the third pads 302 are further arranged on the functional face, wherein protruded metal pillars 307 are arranged on the second redistribution layers 308. In the metal pillars 307, those at edges of the second redistribution layers 308 are used as the external terminals electrically connected to the horizontal metal strips 41 of the metal connection structures 400, and those at middle portions of the second redistribution layers 308 are used as the external terminals with the first solder bumps 309 formed on the top surfaces thereof.

In some embodiments, referring to any of FIG. 6 to FIG. 14, the package structure further includes: second solder bumps 310 on portions of top surfaces of the horizontal metal strips 41 of the metal connection structures 400.

In some embodiments, the second solder bumps 310 have a same size as or different sizes from the first solder bumps 309; and the second solder bumps 310 are disposed outside or inside a boundary of the first chip 301.

In some embodiments, referring to FIG. 5, the package structure further includes: a second chip 203, wherein the second chip 203 is mounted on the first surface of the substrate 100 and is electrically connected to the substrate 100; and heat sinks 204, wherein the heat sinks 204 are mounted on the first surface of the substrate 100.

Some embodiments of the present disclosure provide a method for forming a package structure. The method includes:

- providing a substrate, wherein the substrate includes a first surface and a second surface that are opposite, a plurality of first connection terminals being arranged on the first surface of the substrate, a plurality of second connection terminals being arranged on the second surface of the substrate, the first connection terminals being correspondingly electrically connected to the second connection terminals;
- mounting passive devices on the first surface of the substrate, wherein the passive devices are correspondingly electrically to the first connection terminals on the first surface of the substrate;
- forming a first molding layer encapsulating the passive devices and covering the first surface of the substrate;
- providing a first chip including a back face and a functional face that are opposite, wherein a plurality of external terminals are arranged on the functional face;
- mounting the back face of the first chip on the second surface of the substrate;
- providing metal connection structures, wherein each of the metal connection structures includes a horizontal metal strip and a vertical metal pin electrically connected to the horizontal metal strip, the vertical metal pin protruding from a bottom surface of the horizontal metal strip;
- mounting the metal connection structures on the second surface of the substrate, the vertical metal pins of the metal connection structures are correspondingly electrically connected to the second connection terminals on the second surface of the substrate, and the horizontal metal strips of the metal connection structures are correspondingly electrically connected to a portion of the external terminals on the functional face of the first chip;
- forming a second molding layer encapsulating the metal connection structures and the first chip and covering the second surface of the substrate, wherein the second molding layer exposes top surfaces of another portion of the external terminals on the functional face of the first chip; and
- forming first solder bumps on the exposed top surfaces of the external terminals.

In some embodiments, the horizontal metal strip and the vertical metal pin of the each of the metal connection structures are formed as an integral structure.

In some embodiments, the horizontal metal strip and the vertical metal pin of the each of the metal connection structures are discrete structures, and a bottom surface of the horizontal metal strip is soldered to a top surface of the vertical metal pin via a solder layer.

In some embodiments, the vertical metal pin of the each of the metal connection structures includes a first portion and a second portion, wherein the first portion is disposed over the second portion, a bottom end of the first portion and a top end of the second portion are soldered together via a solder layer, and the first portion and the horizontal metal strip of the each of the metal connection structures are formed as an integral structure.

In some embodiments, the horizontal metal strip and the vertical metal pin of the each of the metal connection structures are discrete structures, and the horizontal metal strip is formed on a top surface of the vertical metal pin by an electroplating process.

In some embodiments, when the metal connection structures are mounted on the second surface of the substrate, bottom surfaces of the vertical metal pins of the metal connection structures are correspondingly electrically connected to the second connection terminals on the second surface of the substrate via first bonding assist layers, and bottom surfaces of the horizontal metal strips of the metal connection structures are correspondingly electrically connected to a portion of the external terminals on the functional face of the first chip via second bonding assist layers.

In some embodiments, the substrate is a metal lead frame, a silicon substrate, a PCB substrate, a resin substrate, a ceramic substrate, or a glass substrate.

In some embodiments, a plurality of discrete pins are arranged in the metal lead frame, wherein an upper surface and a lower surface of each of the plurality of discrete pins are respectively used as the first connection terminal and the second connection terminal.

In some embodiments, each of the silicon substrate, the PCB substrate, the resin substrate, the ceramic substrate, and the glass substrate includes the first surface and the second surface that are opposite, a plurality of first pads are arranged on the first surface, a plurality of second pads are arranged on the second surface, connection traces connecting the first pads and the second pads corresponding thereto are arranged in each of the silicon substrate, the PCB substrate, the resin substrate, the ceramic substrate, and the glass substrate, the first pads are directly used as the first terminals, and the second pads are directly used as the second connection terminals.

In some embodiments, first redistribution layers are arranged on the first surface of the substrate, wherein the first redistribution layers are used as the first connection terminals.

In some embodiments, a plurality of third pads are arranged on the functional face of the first chip, and second redistribution layers correspondingly electrically connected to the third pads are further arranged on the functional face, wherein a portion of the second redistribution layers are used as the external terminals electrically connected to the horizontal metal strips of the metal connection structures, and protruded metal pillars are further arranged on a portion of the second redistribution layers, the metal pillars being used as the external terminals with the first solder bumps formed on the top surfaces thereof.

In some embodiments, a plurality of third pads are arranged on the functional face of the first chip, protruded metal pillars being further arranged on the third pads, wherein a portion of the protruded metal pillars are used as the external terminals electrically connected to the horizontal metal strips of the metal connection structures, and another portion of the metal pillars are used as the external terminals with the first solder bumps formed on the top surfaces thereof.

In some embodiments, the method further includes: forming second solder bumps on portions of top surfaces of the horizontal metal strips of the metal connection structures.

In some embodiments, the second solder bumps have a same size as or different sizes from the first solder bumps; and the second solder bumps are disposed outside or inside a boundary of the first chip.

In some embodiments, the method further includes: providing a second chip, wherein the second chip is mounted on the first surface of the substrate, and is electrically connected to the substrate In some embodiments, the method further includes: providing heat sinks, wherein the heat sinks are mounted on the first surface of the substrate.

Some embodiments of the present disclosure further provide a package structure. The package structure includes:

- a substrate including a first surface and a second surface that are opposite, wherein a plurality of first connection terminals are arranged on the first surface of the substrate, and a plurality of second connection terminals are arranged on the second surface of the substrate, the first connection terminals being correspondingly electrically connected to the second connection terminals;
- passive devices mounted on the first surface of the substrate, wherein the passive devices are correspondingly electrically to the first connection terminals on the first surface of the substrate;
- a first molding layer encapsulating the passive devices and covering the first surface of the substrate;
- a first chip including a back face and a functional face that are opposite, wherein a plurality of external terminals are arranged on the functional face of the first chip, and the back face of the first chip is mounted on the second surface of the substrate; and
- metal connection structures each including a horizontal metal strip and a vertical metal pin electrically connected to the horizontal metal strip, wherein the vertical metal pin protrudes from a bottom surface of the horizontal metal strip, the metal connection structures are mounted on the second surface of the substrate, the vertical metal pins of the metal connection structures are correspondingly electrically connected to the second connection terminals on the second surface of the substrate, and the horizontal metal strips of the metal connection structures are correspondingly electrically connected to a portion of the external terminals on the functional face of the first chip;
- a second molding layer encapsulating the metal connection structures and the first chip and covering the second surface of the substrate, wherein the second molding layer exposes top surfaces of another portion of the external terminals on the functional face of the first chip; and
- first solder bumps on the exposed top surfaces of the external terminals.

In some embodiments, the horizontal metal strip and the vertical metal pin of the each of the metal connection structures are formed as an integral structure.

In some embodiments, the horizontal metal strip and the vertical metal pin of the each of the metal connection structures are discrete structures, and a bottom surface of the horizontal metal strip is soldered to a top surface of the vertical metal pin via a solder layer.

In some embodiments, the vertical metal pin of the each of the metal connection structures includes a first portion and a second portion, wherein the first portion is disposed over the second portion, a bottom end of the first portion and a top end of the second portion are soldered together via a solder layer, and the first portion and the horizontal metal strip of the each of the metal connection structures are formed as an integral structure.

In some embodiments, the horizontal metal strip and the vertical metal pin of the each of the metal connection structures are discrete structures, and the horizontal metal strip is formed a top surface of the vertical metal pin by an electroplating process.

In some embodiments, bottom surfaces of the vertical metal pins of the metal connection structures are correspondingly electrically connected to the second connection terminals on the second surface of the substrate via first bonding assist layers, and bottom surfaces of the horizontal metal strips of the metal connection structures are correspondingly electrically connected to a portion of the external terminals on the functional face of the first chip via second bonding assist layers.

In some embodiments, the substrate is a metal lead frame, a silicon substrate, a PCB substrate, a resin substrate, a ceramic substrate, or a glass substrate.

In some embodiments, a plurality of discrete pins are arranged in the metal lead frame, wherein an upper surface and a lower surface of each of the plurality of discrete pins are respectively used as the first connection terminal and the second connection terminal.

In some embodiments, each of the silicon substrate, the PCB substrate, the resin substrate, the ceramic substrate, and the glass substrate includes the first surface and the second surface that are opposite, a plurality of first pads are arranged on the first surface, a plurality of second pads are arranged on the second surface, connection traces connecting the first pads and the second pads corresponding thereto are arranged in each of the silicon substrate, the PCB substrate, the resin substrate, the ceramic substrate, and the glass substrate, the first pads are directly used as the first terminals, and the second pads are directly used as the second connection terminals.

In some embodiments, first redistribution layers are arranged on the first surface of the substrate, wherein the first redistribution layers are used as the first connection terminals.

In some embodiments, a plurality of third pads are arranged on the functional face of the first chip, and second redistribution layers correspondingly electrically connected to the third pads are further arranged on the functional face, wherein a portion of the second redistribution layers are used as the external terminals electrically connected to the horizontal metal strips of the metal connection structures, and protruded metal pillars are further arranged on a portion of the second redistribution layers, the metal pillars being used as the external terminals with the first solder bumps formed on the top surfaces thereof.

In some embodiments, a plurality of third pads are arranged on the functional face of the first chip, protruded metal pillars being further arranged on the third pads, wherein a portion of the protruded metal pillars are used as the external terminals electrically connected to the horizontal metal strips of the metal connection structures, and another portion of the metal pillars are used as the external terminals with the first solder bumps formed on the top surfaces thereof.

In some embodiments, a plurality of third pads are arranged on the functional face of the first chip, and second redistribution layers correspondingly electrically connected to the third pads are further arranged on the functional face, protruded metal pillars being arranged on the second redistribution layers, wherein in the metal pillars, those at edges of the second redistribution layers are used as the external terminals electrically connected to the horizontal metal strips of the metal connection structures and those at middle portions of the second redistribution layers are used as the external terminals with the first solder bumps formed on the top surfaces thereof.

In some embodiments, the package structure further includes: second solder bumps on portions of top surfaces of the horizontal metal strips of the metal connection structures.

In some embodiments, the second solder bumps have a same size as or different sizes from the first solder bumps; and the second solder bumps are disposed outside or inside a boundary of the first chip.

In some embodiments, the package structure further includes: a second chip, wherein the second chip is mounted on the first surface of the substrate, and is electrically connected to the substrate.

In some embodiments, the package structure further includes: heat sinks, wherein the heat sinks are mounted on the first surface of the substrate.

In the package structure and the method for forming the same according to the embodiments of the present disclosure, the method includes: mounting passive devices on a first surface of a substrate, and forming a first molding layer encapsulating the passive devices and covering the first surface of the substrate; mounting a back face of a first chip on a second surface of the substrate; providing metal connection structures, wherein each of the metal connection structures includes a horizontal metal strip and a vertical metal pin electrically connected to the horizontal metal strip, wherein the vertical metal pin protrudes from a bottom surface of the horizontal metal strip; and mounting the metal connection structures on the second surface of the substrate, wherein the vertical metal pins of the metal connection structures are correspondingly electrically connected to the second connection terminals on the second surface of the substrate, and the horizontal metal strips of the metal connection structures are correspondingly electrically connected to a portion of the external terminals on the functional face of the first chip. When mounting the passive devices, the number of passive devices in the package is increased since the passive devices are not limited by the area of the back face of the first chip. In addition, the metal connection structures are mounted on the second surface of the substrate, the first chip and the substrate are interconnected, and interconnection between the first chip and the passive devices are achieved by the substrate. The mounting process of the metal connection structures is simpler relative to the through silicon via process, and thus the cost is lowered.

In addition, terms “comprise,” “include,” and variations thereof used herein in the text of the present disclosure are intended to define a non-exclusive meaning. It should be noted that the terms such as “first,” “second,” and the like in the specifications, claims and the accompanying drawings of the present disclosure are intended to distinguish different objects but are not intended to define a specific order or a definite time sequence. Unless otherwise clearly indicated in the context, it should be understood that the data used in this way can be interchanged under appropriate circumstances. In cases of no conflict, the embodiments and features in the embodiments of the present disclosure may be combined together. Further, in the above description, descriptions of well-known components and techniques are omitted so as not to unnecessarily obscure the inventive concepts of the present disclosure. In various embodiments of the present disclosure, the same or similar parts between the embodiments may be referenced to each other. In each embodiment, the portion that is different from other embodiments is concentrated and described.

Although the present invention has been disclosed above with reference to preferred embodiments, these embodiments are not intended to limit the present invention but illustrate the present invention. Without departing from the spirit and scope of the present invention, any person skilled in the art may make possible variations and modifications to the technical solutions based on the method and technical content disclosed herein in this literature. Therefore, any content without departing from the technical solutions of the present invention and any simple variation, equivalent replacement and modification made based on the technical essence of the present invention shall fall within the protection scope defined by the technical solutions of the present invention.

What is claimed is:

1. A package structure, comprising:

a substrate comprising a first surface and a second surface that are opposite, wherein a plurality of first connection terminals are arranged on the first surface of the substrate, and a plurality of second connection terminals are arranged on the second surface of the substrate, the plurality of first connection terminals being correspondingly electrically connected to the plurality of second connection terminals;

passive devices mounted on the first surface of the substrate, wherein the passive devices are correspondingly electrically to the plurality of first connection terminals on the first surface of the substrate;

a first molding layer encapsulating the passive devices and covering the first surface of the substrate;

a first chip comprising a back face and a functional face that are opposite, wherein a plurality of external terminals are arranged on the functional face of the first chip, and the back face of the first chip is mounted on the second surface of the substrate; and metal connection structures each comprising a horizontal metal strip and a vertical metal pin electrically connected to the horizontal metal strip, wherein the vertical metal pin protrudes from a bottom surface of the horizontal metal strip, the metal connection structures are mounted on the second surface of the substrate, the vertical metal pins of the metal connection structures are correspondingly electrically connected to the plurality of second connection terminals on the second surface of the substrate, and the horizontal metal strips of the metal connection structures are correspondingly electrically connected to a portion of the plurality of external terminals on the functional face of the first chip;

a second molding layer encapsulating the metal connection structures and the first chip and covering the second surface of the substrate, wherein the second molding layer exposes top surfaces of another portion of the plurality of external terminals on the functional face of the first chip; and first solder bumps on the exposed top surfaces of the plurality of external terminals.

2. The package structure according to claim 1, wherein the horizontal metal strip and the vertical metal pin of each of the metal connection structures are formed as an integral structure.

3. The package structure according to claim 1, wherein the vertical metal pin of each of the metal connection structures comprises a first portion and a second portion, wherein the first portion is disposed over the second portion, a bottom end of the first portion and a top end of the second portion are soldered together via a solder layer, and the first portion and the horizontal metal strip of each of the metal connection structures are formed as an integral structure.

4. The package structure according to claim 1, wherein the horizontal metal strip and the vertical metal pin of each of the metal connection structures are discrete structures, and the horizontal metal strip is formed on a top surface of the vertical metal pin by an electroplating process.

5. The package structure according to claim 2, wherein bottom surfaces of the vertical metal pins of the metal connection structures are correspondingly electrically connected to the plurality of second connection terminals on the second surface of the substrate via first bonding assist layers, and bottom surfaces of the horizontal metal strips of the metal connection structures are correspondingly electrically connected to a portion of the plurality of external terminals on the functional face of the first chip via second bonding assist layers.

6. The package structure according to claim 1, wherein the substrate is a metal lead frame, a plurality of discrete pins are arranged in the metal lead frame, wherein an upper surface and a lower surface of each of the plurality of discrete pins are respectively used as the plurality of first connection terminals and the plurality of second connection terminals.

7. The package structure according to claim 1, wherein the substrate is a silicon substrate, a PCB substrate, a resin substrate, a ceramic substrate, or a glass substrate, each of the substrate comprises the first surface and the second surface that are opposite, a plurality of first pads are arranged on the first surface, a plurality of second pads are arranged on the second surface, connection traces connecting the plurality of first pads and the plurality of second pads corresponding thereto are arranged in each of the substrate, the plurality of first pads are directly used as the plurality of first connection terminals, and the plurality of second pads are directly used as the plurality of second connection terminals.

8. The package structure according to claim 1, wherein a plurality of third pads are arranged on the functional face of the first chip, and second redistribution layers correspondingly electrically connected to the plurality of third pads are further arranged on the functional face, wherein a portion of the second redistribution layers are used as the plurality of external terminals electrically connected to horizontal metal strips of the metal connection structures, and protruded metal pillars are further arranged on a portion of the second redistribution layers, the protruded metal pillars being used as the plurality of external terminals with the first solder bumps formed on the top surfaces thereof.

9. The package structure according to claim 1, wherein a plurality of third pads are arranged on the functional face of the first chip, protruded metal pillars being further arranged on the plurality of third pads, wherein a portion of the protruded metal pillars are used as the plurality of external terminals electrically connected to horizontal metal strips of the metal connection structures, and another portion of the protruded metal pillars are used as the plurality of external terminals with the first solder bumps formed on the top surfaces thereof.

10. The package structure according to claim 1, wherein a plurality of third pads are arranged on the functional face of the first chip, and second redistribution layers correspondingly electrically connected to the plurality of third pads are further arranged on the functional face, protruded metal pillars being arranged on the second redistribution layers, wherein in the protruded metal pillars, those at edges of the second redistribution layers are used as the plurality of external terminals electrically connected to horizontal metal strips of the metal connection structures and those at middle portions of the second redistribution layers are used as the plurality of external terminals with the first solder bumps formed on the top surfaces thereof.

11. The package structure according to claim 1, further comprising: second solder bumps on a portion of top surfaces of horizontal metal strips of the metal connection structures.

12. A method for forming a package structure, comprising:

providing a substrate, wherein the substrate comprises a first surface and a second surface that are opposite, a plurality of first connection terminals being arranged on the first surface of the substrate, a plurality of second connection terminals being arranged on the second surface of the substrate, the plurality of first connection terminals being correspondingly electrically connected to the plurality of second connection terminals;

mounting passive devices on the first surface of the substrate, wherein the passive devices are correspondingly electrically to the plurality of first connection terminals on the first surface of the substrate;

forming a first molding layer encapsulating the passive devices and covering the first surface of the substrate;

providing a first chip comprising a back face and a functional face that are opposite, wherein a plurality of external terminals are arranged on the functional face;

mounting the back face of the first chip on the second surface of the substrate;

providing metal connection structures, wherein each of the metal connection structures comprises a horizontal metal strip and a vertical metal pin electrically connected to the horizontal metal strip, the vertical metal pin protruding from a bottom surface of the horizontal metal strip;

mounting the metal connection structures on the second surface of the substrate, the vertical metal pins of the metal connection structures are correspondingly electrically connected to the plurality of second connection terminals on the second surface of the substrate, and the horizontal metal strips of the metal connection structures are correspondingly electrically connected to a portion of the plurality of external terminals on the functional face of the first chip;

forming a second molding layer encapsulating the metal connection structures and the first chip and covering the second surface of the substrate, wherein the second molding layer exposes top surfaces of another portion of the plurality of external terminals on the functional face of the first chip; and forming first solder bumps on the exposed top surfaces of the plurality of external terminals.

13. The method according to claim 12, wherein the horizontal metal strip and the vertical metal pin of each of the metal connection structures are formed as an integral structure.

14. The method according to claim 12, wherein the horizontal metal strip and the vertical metal pin of each of the metal connection structures are discrete structures, and a portion of a bottom surface of the horizontal metal strip is soldered to a top surface of the vertical metal pin via a solder layer.

15. The method according to claim 12, wherein the vertical metal pin of each of the metal connection structures comprises a first portion and a second portion, wherein the first portion is disposed over the second portion, a bottom end of the first portion and a top end of the second portion are soldered together via a solder layer, and the first portion and the horizontal metal strip of each of the metal connection structures are formed as an integral structure.

16. The method according to claim 12, wherein the horizontal metal strip and the vertical metal pin of each of the metal connection structures are discrete structures, and the horizontal metal strip is formed on a top surface of the vertical metal pin by an electroplating process.

17. The method according to claim 12, wherein when the metal connection structures are mounted on the second surface of the substrate, bottom surfaces of the vertical metal pins of the metal connection structures are correspondingly electrically connected to the plurality of second connection terminals on the second surface of the substrate via first bonding assist layers, and bottom surfaces of horizontal metal strips of the metal connection structures are correspondingly electrically connected to a portion of the plurality of external terminals on the functional face of the first chip via second bonding assist layers.

18. The method according to claim 12, wherein first redistribution layers are arranged on the first surface of the substrate, wherein the first redistribution layers are used as the plurality of first connection terminals.

19. The method according to claim 12, wherein a plurality of third pads are arranged on the functional face of the first chip, and second redistribution layers correspondingly electrically connected to the plurality of third pads are further arranged on the functional face, wherein a portion of the second redistribution layers are used as the plurality of external terminals electrically connected to horizontal metal strips of the metal connection structures, and protruded metal pillars are further arranged on a portion of the second redistribution layers, the protruded metal pillars being used as the plurality of external terminals with the first solder bumps formed on the top surfaces thereof.

20. The method according to claim 12, wherein a plurality of third pads are arranged on the functional face of the first chip, protruded metal pillars being further arranged on the plurality of third pads, wherein a portion of the protruded metal pillars are used as the plurality of external terminals electrically connected to horizontal metal strips of the metal connection structures, and another portion of the protruded metal pillars are used as the plurality of external terminals with the first solder bumps formed on the top surfaces thereof.

* * * * *